(12) United States Patent
Fish, Jr. et al.

(10) Patent No.: US 9,224,889 B2
(45) Date of Patent: Dec. 29, 2015

(54) OPTICAL ASSEMBLY FOR A LIGHT SENSOR, LIGHT SENSOR ASSEMBLY USING THE OPTICAL ASSEMBLY, AND VEHICLE REARVIEW ASSEMBLY USING THE LIGHT SENSOR ASSEMBLY

(75) Inventors: Richard T. Fish, Jr., Jenison, MI (US); Danny L. Minikey, Jr., Fenwick, MI (US); Darin D. Tuttle, Byron Center, MI (US)

(73) Assignee: GENTEX CORPORATION, Zeeland, MI (US)

( * ) Notice: Subject to any disclaimer, the term of this patent is extended or adjusted under 35 U.S.C. 154(b) by 475 days.

(21) Appl. No.: 13/565,837

(22) Filed: Aug. 3, 2012

(65) Prior Publication Data

US 2013/0032704 A1     Feb. 7, 2013

Related U.S. Application Data

(60) Provisional application No. 61/515,389, filed on Aug. 5, 2011.

(51) Int. Cl.
| | |
|---|---|
| *H01L 31/0232* | (2014.01) |
| *B60R 1/04* | (2006.01) |
| *B60R 1/12* | (2006.01) |

(Continued)

(52) U.S. Cl.
CPC ............ *H01L 31/02325* (2013.01); *B60R 1/04* (2013.01); *B60R 1/088* (2013.01); *B60R 1/12* (2013.01); *B60R 2001/1223* (2013.01); *G02B 19/0028* (2013.01); *G02B 19/0076* (2013.01)

(58) Field of Classification Search
USPC .................. 250/216, 234, 239; 359/265–275; 356/601–604
See application file for complete search history.

(56) References Cited

U.S. PATENT DOCUMENTS

| 2,632,040 A | 3/1953 | Rabinow |
| 2,762,930 A | 9/1956 | Onksen, Jr. et al. |

(Continued)

FOREIGN PATENT DOCUMENTS

| DE | 2946561 | 5/1981 |
| DE | 19526249 | 2/1996 |

(Continued)

OTHER PUBLICATIONS

Patent Cooperation Treaty, International Searching Authority, International Search Report, Written Opinion of the International Searching Authority and Notification of Transmittal, Nov. 29, 2012, 6 Pages.

(Continued)

*Primary Examiner* — Francis M Legasse, Jr.
(74) *Attorney, Agent, or Firm* — Price Heneveld LLP; Scott P. Ryan

(57) ABSTRACT

An optical assembly is provided wherein the optical assembly includes a first optical element and a second optical element. The first optical element is configured to receive light and alter a transmission path of the light through the first optical element in a first direction and a second direction. The second optical element is configured to receive the light from the first optical element, and alter a transmission path of the light through the second optical element in the first and second directions. The light is passed through the second optical element, such that a sensor receives light from a field of view that is approximately 30 degrees to 60 degrees offset from a field of view of the sensor.

20 Claims, 9 Drawing Sheets

(51) Int. Cl.
   B60R 1/08 (2006.01)
   G02B 19/00 (2006.01)

(56) References Cited

U.S. PATENT DOCUMENTS

| | | | |
|---|---|---|---|
| 2,827,594 A | 3/1958 | Rabinow | |
| 3,260,849 A | 7/1966 | Polye | |
| 3,601,614 A | 8/1971 | Platzer, Jr. | |
| 3,680,951 A | 8/1972 | Jordan et al. | |
| 3,711,722 A | 1/1973 | Kavanagh | |
| 3,746,430 A | 7/1973 | Brean et al. | |
| 3,749,477 A | 7/1973 | Willoughby et al. | |
| 3,828,220 A | 8/1974 | Moore et al. | |
| 3,866,067 A | 2/1975 | Amelio | |
| 3,914,309 A | 10/1975 | Swensen | |
| 4,023,368 A | 5/1977 | Kelly | |
| 4,140,142 A | 2/1979 | Dormidontov et al. | |
| 4,161,653 A | 7/1979 | Bedini et al. | |
| 4,208,668 A | 6/1980 | Krimmel | |
| 4,225,782 A | 9/1980 | Kuppenheimer et al. | |
| 4,293,877 A | 10/1981 | Tsunekawa et al. | |
| 4,315,159 A | 2/1982 | Niwa et al. | |
| 4,355,271 A | 10/1982 | Noack | |
| 4,443,057 A | 4/1984 | Bauer et al. | |
| 4,465,370 A | 8/1984 | Yuasa et al. | |
| 4,469,417 A | 9/1984 | Masunaga et al. | |
| 4,475,036 A | 10/1984 | Bauer et al. | |
| 4,547,676 A | 10/1985 | Suzuki et al. | |
| 4,580,875 A | 4/1986 | Bechtel et al. | |
| 4,603,946 A | 8/1986 | Kato et al. | |
| 4,620,141 A | 10/1986 | McCumber et al. | |
| 4,632,509 A | 12/1986 | Ohmi et al. | |
| 4,652,745 A | 3/1987 | Zanardelli | |
| 4,669,826 A | 6/1987 | Itoh et al. | |
| 4,678,938 A | 7/1987 | Nakamura | |
| 4,684,222 A | 8/1987 | Borrelli et al. | |
| 4,690,508 A | 9/1987 | Jacob | |
| 4,692,798 A | 9/1987 | Seko et al. | |
| 4,697,883 A | 10/1987 | Suzuki et al. | |
| 4,701,022 A | 10/1987 | Jacob | |
| 4,770,514 A | 9/1988 | Silverglate | |
| 4,793,690 A | 12/1988 | Gahan et al. | |
| 4,798,956 A | 1/1989 | Hochstein | |
| 4,799,768 A | 1/1989 | Gahan | |
| 4,819,071 A | 4/1989 | Nakamura | |
| 4,859,867 A | 8/1989 | Larson et al. | |
| 4,862,037 A | 8/1989 | Farber et al. | |
| 4,867,561 A | 9/1989 | Fujii et al. | |
| 4,871,917 A | 10/1989 | O'Farrell et al. | |
| 4,886,960 A | 12/1989 | Molyneux et al. | |
| 4,891,559 A | 1/1990 | Matsumoto et al. | |
| 4,902,108 A | 2/1990 | Byker | |
| 4,916,307 A | 4/1990 | Nishibe et al. | |
| 4,916,374 A | 4/1990 | Schierbeek et al. | |
| 4,917,477 A | 4/1990 | Bechtel et al. | |
| 4,930,742 A | 6/1990 | Schofield et al. | |
| 4,956,591 A | 9/1990 | Schierbeek et al. | |
| 4,960,996 A | 10/1990 | Hochstein | |
| 4,967,319 A | 10/1990 | Seko | |
| 4,973,844 A | 11/1990 | O'Farrell et al. | |
| 4,987,354 A | 1/1991 | Steinmann | |
| 5,036,437 A | 7/1991 | Macks | |
| 5,105,207 A | 4/1992 | Nelson | |
| 5,124,549 A | 6/1992 | Michaels et al. | |
| 5,140,455 A | 8/1992 | Varaprasad et al. | |
| 5,160,971 A | 11/1992 | Koshizawa | |
| 5,172,206 A | 12/1992 | Iizuka | |
| 5,204,778 A | 4/1993 | Bechtel | |
| 5,214,274 A | 5/1993 | Yang | |
| 5,214,275 A | 5/1993 | Freeman et al. | |
| 5,220,317 A | 6/1993 | Lynam et al. | |
| 5,235,178 A | 8/1993 | Hegyi | |
| 5,243,215 A | 9/1993 | Enomoto et al. | |
| 5,276,389 A | 1/1994 | Levers | |
| 5,306,992 A | 4/1994 | Droge | |
| 5,313,072 A | 5/1994 | Vachss | |
| 5,329,206 A | 7/1994 | Slotkowski et al. | |
| 5,336,980 A | 8/1994 | Levers | |
| 5,338,691 A | 8/1994 | Enomoto et al. | |
| 5,343,330 A * | 8/1994 | Hoffman et al. | 359/708 |
| 5,386,111 A | 1/1995 | Zimmerman | |
| 5,386,128 A | 1/1995 | Fossum et al. | |
| 5,400,072 A | 3/1995 | Izumi et al. | |
| 5,410,455 A | 4/1995 | Hashimoto | |
| 5,416,313 A | 5/1995 | Larson et al. | |
| 5,416,318 A | 5/1995 | Hegyi | |
| 5,426,294 A | 6/1995 | Kobayashi et al. | |
| 5,434,407 A | 7/1995 | Bauer et al. | |
| 5,451,822 A | 9/1995 | Bechtel et al. | |
| 5,471,515 A | 11/1995 | Fossum | |
| 5,483,346 A | 1/1996 | Butzer | |
| 5,488,416 A | 1/1996 | Kyuma | |
| 5,498,866 A | 3/1996 | Bendicks et al. | |
| 5,508,592 A | 4/1996 | Lapatovich et al. | |
| 5,526,190 A | 6/1996 | Hubble, III et al. | |
| 5,537,003 A | 7/1996 | Bechtel et al. | |
| 5,550,677 A | 8/1996 | Schofield et al. | |
| 5,561,773 A | 10/1996 | Kalish et al. | |
| 5,581,240 A | 12/1996 | Egger | |
| 5,598,146 A | 1/1997 | Schroder | |
| 5,602,384 A | 2/1997 | Nunogaki et al. | |
| 5,614,788 A | 3/1997 | Mullins et al. | |
| 5,625,210 A | 4/1997 | Lee et al. | |
| 5,644,418 A | 7/1997 | Woodward | |
| 5,650,643 A | 7/1997 | Konuma | |
| 5,659,294 A | 8/1997 | Schroder | |
| 5,659,423 A | 8/1997 | Schierbeek et al. | |
| 5,660,454 A | 8/1997 | Mori et al. | |
| 5,661,303 A | 8/1997 | Teder | |
| 5,663,542 A | 9/1997 | Kohr et al. | |
| 5,666,028 A | 9/1997 | Bechtel et al. | |
| 5,666,037 A | 9/1997 | Reime | |
| 5,675,438 A | 10/1997 | Nagao et al. | |
| 5,703,568 A | 12/1997 | Hegyi | |
| 5,712,685 A | 1/1998 | Dumas | |
| 5,715,093 A | 2/1998 | Schierbeek et al. | |
| 5,724,187 A | 3/1998 | Varaprasad et al. | |
| RE35,762 E | 4/1998 | Zimmerman | |
| 5,743,946 A | 4/1998 | Aoki et al. | |
| 5,760,962 A | 6/1998 | Schofield et al. | |
| 5,789,737 A | 8/1998 | Street | |
| 5,796,094 A | 8/1998 | Schofield et al. | |
| 5,796,106 A | 8/1998 | Noack | |
| 5,808,350 A | 9/1998 | Jack et al. | |
| 5,811,793 A | 9/1998 | Pientka | |
| 5,818,600 A | 10/1998 | Bendicks et al. | |
| 5,821,863 A | 10/1998 | Schroder et al. | |
| 5,837,994 A | 11/1998 | Stam et al. | |
| 5,841,126 A | 11/1998 | Fossum et al. | |
| 5,841,159 A | 11/1998 | Lee et al. | |
| 5,841,177 A | 11/1998 | Komoto et al. | |
| 5,844,682 A * | 12/1998 | Kiyomoto et al. | 356/237.1 |
| 5,869,883 A | 2/1999 | Mehringer et al. | |
| 5,872,437 A | 2/1999 | Pientka et al. | |
| 5,877,897 A | 3/1999 | Schofield et al. | |
| 5,883,605 A | 3/1999 | Knapp | |
| 5,904,493 A | 5/1999 | Lee et al. | |
| 5,923,027 A | 7/1999 | Stam et al. | |
| 5,942,853 A | 8/1999 | Piscart | |
| 5,990,469 A | 11/1999 | Bechtel et al. | |
| 6,008,486 A | 12/1999 | Stam et al. | |
| 6,027,955 A | 2/2000 | Lee et al. | |
| 6,037,824 A | 3/2000 | Takahashi | |
| 6,069,378 A | 5/2000 | Toyoda et al. | |
| 6,097,023 A | 8/2000 | Schofield et al. | |
| 6,114,688 A | 9/2000 | Tanaka et al. | |
| 6,169,295 B1 | 1/2001 | Koo | |
| 6,196,688 B1 | 3/2001 | Caskey et al. | |
| 6,313,457 B1 | 11/2001 | Bauer et al. | |
| 6,320,182 B1 | 11/2001 | Hubble, III et al. | |
| 6,323,487 B1 | 11/2001 | Wu | |
| 6,359,274 B1 | 3/2002 | Nixon et al. | |
| 6,376,824 B1 | 4/2002 | Michenfelder et al. | |
| 6,379,013 B1 | 4/2002 | Bechtel et al. | |

(56) References Cited

U.S. PATENT DOCUMENTS

| | | |
|---|---|---|
| 6,389,687 B1 | 5/2002 | Glenn et al. |
| 6,396,040 B1 | 5/2002 | Hill |
| 6,441,886 B2 | 8/2002 | Suzuki et al. |
| 6,504,142 B2 | 1/2003 | Nixon et al. |
| 6,521,916 B2 | 2/2003 | Roberts et al. |
| 6,547,404 B2 | 4/2003 | Schierbeek |
| 6,548,808 B2 | 4/2003 | Ozawa |
| 6,618,181 B2 | 9/2003 | Bauer et al. |
| 6,679,608 B2 | 1/2004 | Bechtel et al. |
| 6,831,268 B2 | 12/2004 | Bechtel et al. |
| 6,918,674 B2 | 7/2005 | Drummond et al. |
| 6,947,077 B1 | 9/2005 | Krymski |
| 7,342,707 B2 | 3/2008 | Roberts et al. |
| 7,361,875 B2 | 4/2008 | Bechtel et al. |
| 7,524,092 B2 | 4/2009 | Rodriguez Barros et al. |
| 7,543,946 B2 | 6/2009 | Ockerse et al. |
| 7,855,755 B2 | 12/2010 | Weller et al. |
| 8,339,526 B2 | 12/2012 | Minikey, Jr. et al. |
| 2003/0127583 A1* | 7/2003 | Bechtel et al. ............... 250/216 |
| 2005/0024729 A1* | 2/2005 | Ockerse et al. ............... 359/603 |
| 2008/0179402 A1* | 7/2008 | Barkan et al. ............ 235/462.41 |

FOREIGN PATENT DOCUMENTS

| | | |
|---|---|---|
| EP | 000653 | 2/1979 |
| EP | 0677731 | 11/2002 |
| FR | 2641237 | 7/1990 |
| FR | 2726144 | 4/1996 |
| GB | 2056059 | 3/1981 |
| GB | 2169861 | 7/1986 |
| GB | 2342502 | 4/2000 |
| JP | 5036790 | 11/1975 |
| JP | 59199347 | 11/1984 |
| JP | 61291241 | 12/1986 |
| JP | 0174413 | 3/1989 |
| JP | H1237232 | 9/1989 |
| JP | 05340816 | 12/1993 |
| JP | 08107235 | 4/1996 |
| JP | 8166221 | 6/1996 |
| JP | 9126998 | 5/1997 |
| JP | 09331075 | 12/1997 |
| JP | 11087785 | 3/1999 |
| JP | 2971750 | 8/1999 |
| JP | 2000031582 | 1/2000 |
| JP | 2000133821 | 5/2000 |
| JP | 2001077424 | 3/2001 |
| JP | 2002134794 | 5/2002 |
| WO | WO8605147 | 9/1986 |

OTHER PUBLICATIONS

Tohru Shimizu et al., "SAE Paper No. 980322, pp. 113-117."
Christopher M. Kormanyos, "SAE Paper No. 980003, pp. 13-18."
Franz-Josef Kalze, "SAE Paper No. 980005, pp. 23-26."
J.P. Lowenau et al., "SAE Paper No. 980007, pp. 33-38."

* cited by examiner

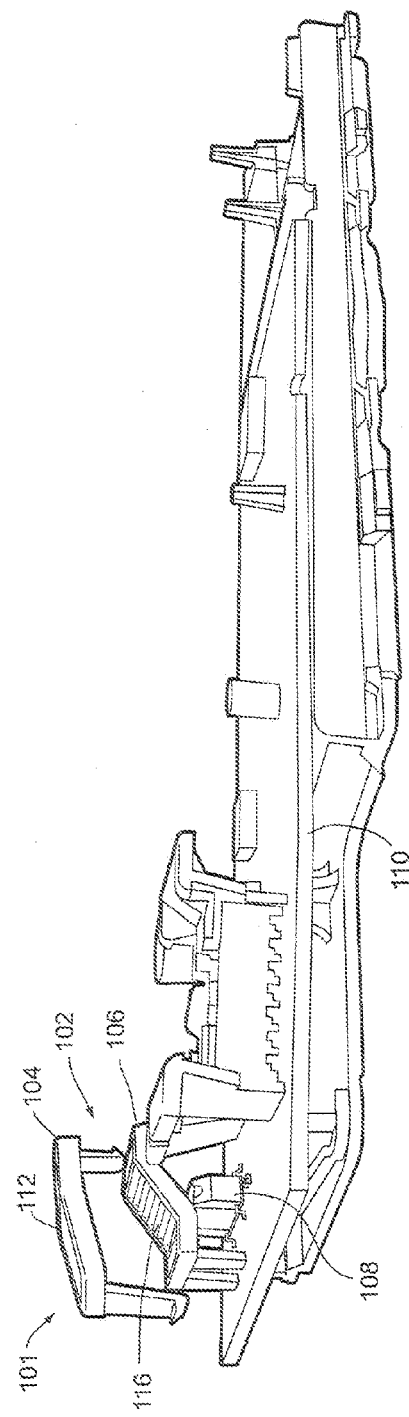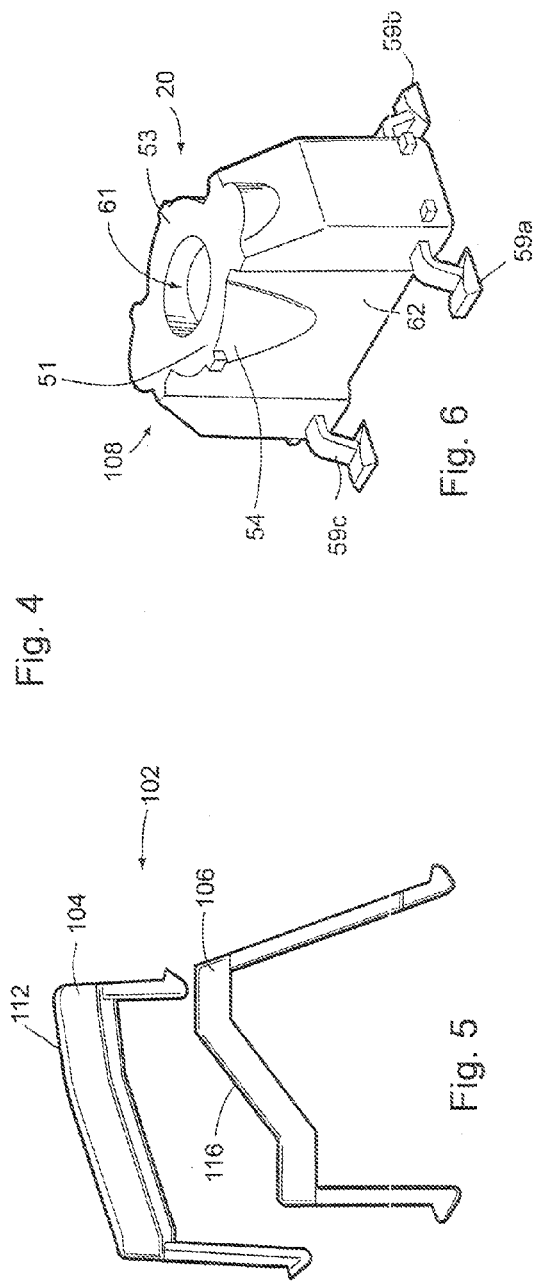

OPTICAL ASSEMBLY FOR A LIGHT SENSOR, LIGHT SENSOR ASSEMBLY USING THE OPTICAL ASSEMBLY, AND VEHICLE REARVIEW ASSEMBLY USING THE LIGHT SENSOR ASSEMBLY

CROSS-REFERENCE TO RELATED APPLICATION

This application claims the benefit of U.S. Provisional Application No. 61/515,389 filed on Aug. 5, 2011, by Richard T. Fish et al. and entitled "OPTICAL ASSEMBLY FOR LIGHT SENSOR," the entire disclosure of which is incorporated herein by reference.

FIELD OF THE INVENTION

The present invention generally relates to an optical assembly for a light sensor, and more particularly, an optical assembly for a light sensor in an auto-dimming rearview assembly.

SUMMARY OF THE INVENTION

According to one aspect of the present invention, an optical assembly includes a first optical element configured to receive light and alter a transmission path of the light through the first optical element in a first direction and a second direction, and a second optical element in optical communication with the first optical element, the second optical element configured to receive the light from the first optical element, and alter a transmission path of the light through the second optical element in the first and second directions, wherein the light is passed through the second optical element, such that a sensor receives light from a field of view that is approximately 30 degrees to 60 degrees offset from a field of view of the sensor.

According to another embodiment, a light sensor assembly is provided that comprises: a light sensor; a first optical element configured to receive light and alter a transmission path of the light through the first optical element in a first direction and a second direction; and a second optical element in optical communication with the first optical element, the second optical element configured to receive the light from the first optical element, and alter a transmission path of the light through the second optical element in the first and second directions, wherein the light is passed through the second optical element such that the light sensor receives light from a field of view that is approximately 30 degrees to 60 degrees offset from a field of view of the light sensor.

According to another embodiment, a rearview assembly for a vehicle is provided that comprises: a housing configured for mounting to the vehicle; a rearview element disposed in the housing that presents images of a scene rearward of the vehicle; a light sensor assembly disposed in the housing; and a controller for receiving the electrical signal of the light sensor and for adjusting a brightness of the images presented by the rearview element. The light sensor comprises: a light sensor for outputting an electrical signal representing intensity of light impinging upon a light receiving surface of the light sensor; a first optical element configured to receive light and alter a transmission path of the light through the first optical element in a first direction and a second direction; and a second optical element in optical communication with the first optical element, the second optical element configured to receive the light from the first optical element, and alter a transmission path of the light through the second optical element in the first and second directions, wherein the light is passed through the second optical element such that the light sensor receives light from a field of view that is approximately 30 degrees to 60 degrees horizontally offset from a field of view of the light sensor.

These and other features, advantages, and objects of the present invention will be further understood and appreciated by those skilled in the art by reference to the following specification, claims, and appended drawings.

BRIEF DESCRIPTION OF THE DRAWINGS

The present invention will become more fully understood from the detailed description and the accompanying drawings, wherein:

FIG. 4 is an environmental view of an optical assembly, in accordance with one embodiment of the present invention;

FIG. 5 is a perspective view of an optical assembly, in accordance with one embodiment of the present invention;

FIG. 6 is a perspective view of a light sensor device that may be used with the embodiments of the present invention;

DETAILED DESCRIPTION OF THE PREFERRED EMBODIMENTS

Figure 1:
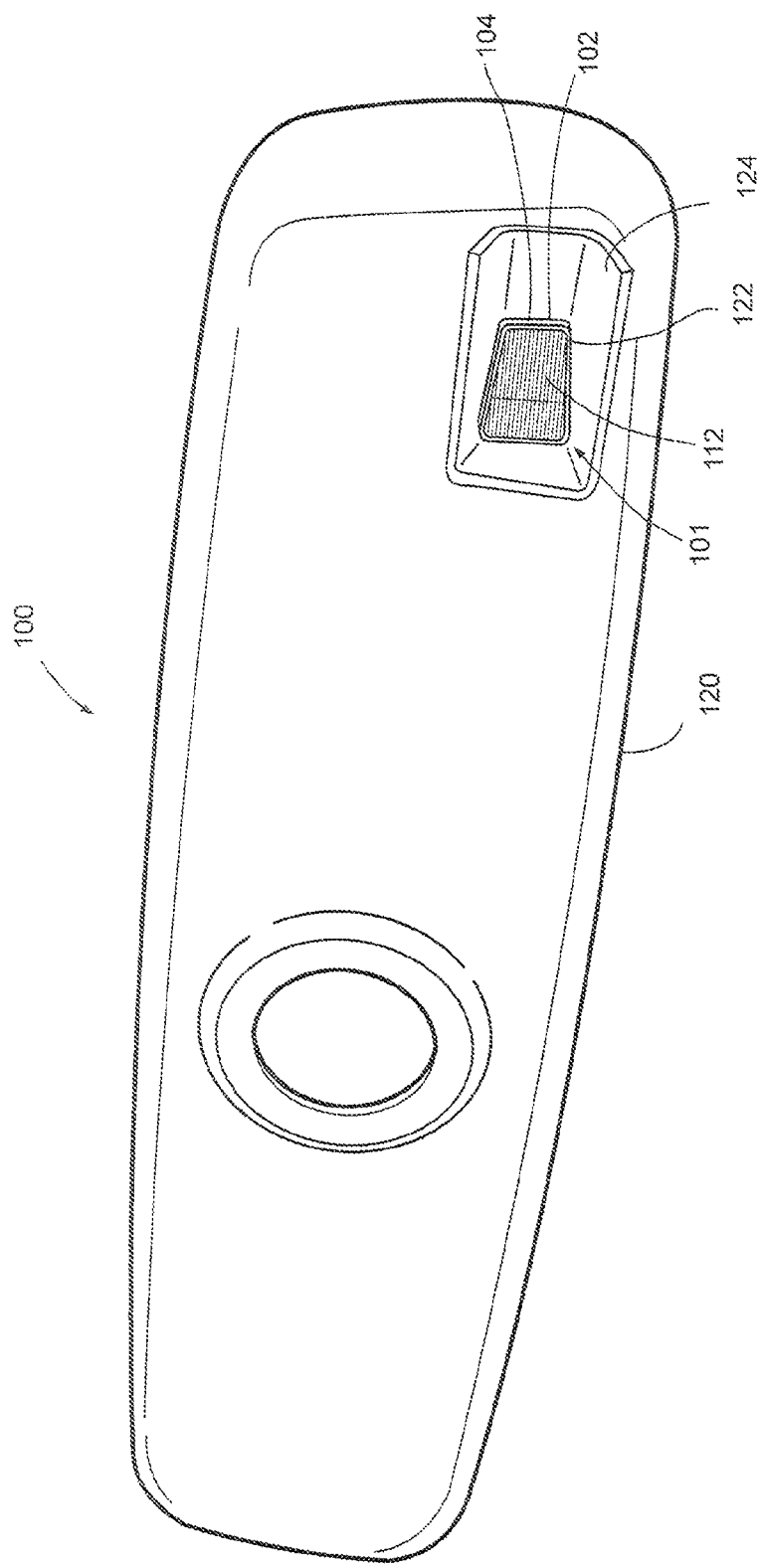
FIG. 1 is a perspective view of a rearview assembly having an optical assembly, in accordance with one embodiment of the present invention.

The present illustrated embodiments reside primarily in combinations of method steps and apparatus components related to an optical assembly for a light sensor. Accordingly, the apparatus components and method steps have been represented, where appropriate, by conventional symbols in the drawings, showing only those specific details that are pertinent to understanding the embodiments of the present invention so as not to obscure the disclosure with details that will be readily apparent to those of ordinary skill in the art having the benefit of the description herein. Further, like numerals in the description and drawings represent like elements.

In this document, relational terms, such as first and second, top and bottom, and the like, are used solely to distinguish one entity or action from another entity or action, without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements, but may include other elements not expressly listed or inherent to such process, method, article, or apparatus. An element proceeded by "comprises . . . a" does not, without more constraints, preclude the existence of additional identical elements in the process, method, article, or apparatus that comprises the element.

Figure 2A:
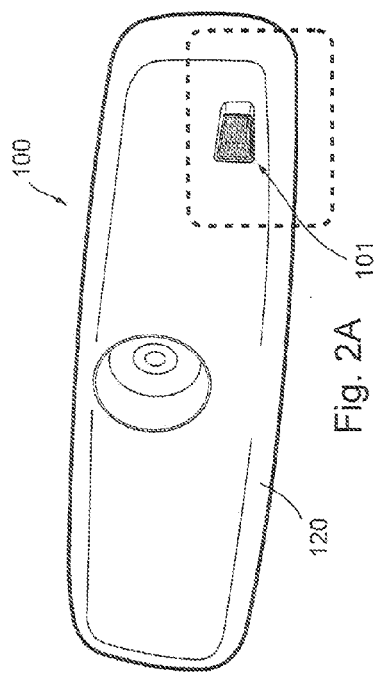
FIG. 2A is a perspective view of a rearview assembly having an optical assembly, in accordance with one embodiment of the present invention.
Figure 2B:
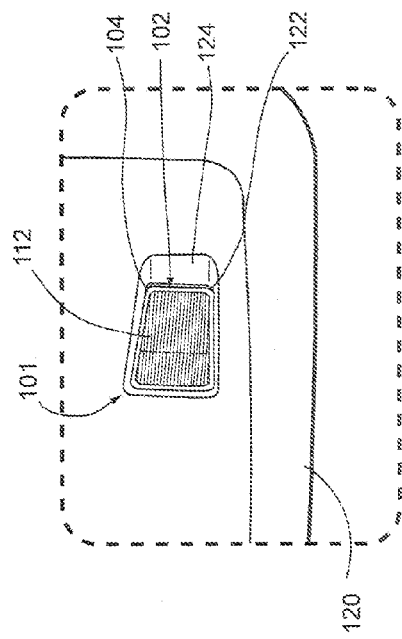
FIG. 2B is a perspective view of the optical assembly in the rearview assembly of FIG. 2A.
Figure 3:
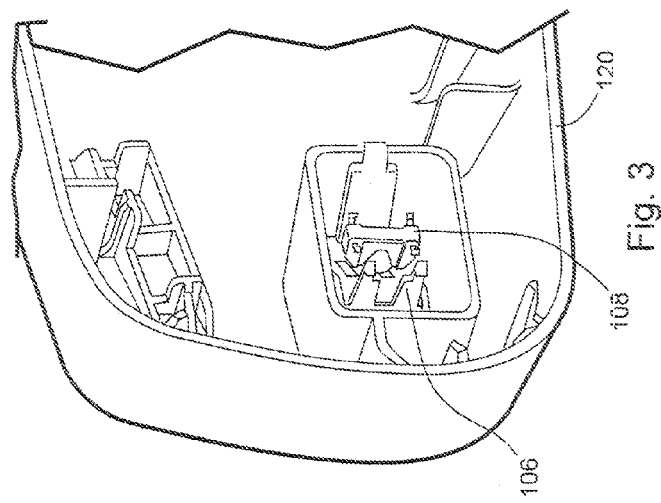
FIG. 3 is a partial rear perspective view of the optical assembly in the rearview assembly of FIG. 2A.

In reference to FIGS. 1-3, a rearview assembly is generally shown at reference identifier 100. The rearview assembly 100 includes a light sensor assembly 101 including an optical assembly generally indicated at reference identifier 102 and a light sensor 108. As illustrated in FIGS. 4, 5, 9, and 10, the optical assembly 102 includes a first optical element 104 that can be configured to receive light and alter a transmission path of the light through the first optical element 104 in a first direction and a second direction. The optical assembly 102 can also include a second optical element 106 in optical communication with the first optical element 104, wherein the second optical element 106 can be configured to receive light from the first optical element 104 and alter a transmission path of the light through the second optical element 106 in the first and second directions. Thus, the light passed through the second optical element 106 can be received by the light sensor 108, such that the light sensor 108 receives light from a field of view that is approximately 30 degrees to 60 degrees offset from a field of view of the light sensor 108. When used in a rearview assembly, the received field of view may be approximately 30 to 60 degrees horizontally offset, particularly horizontally offset away from the middle of the mirror housing or mount. The optical elements may further be configured such that the light sensor 108 receives light from a field of view that is approximately 40 degrees to 50 degrees offset from a field of view of the light sensor 108. The optical elements may further be configured such that the light sensor 108 receives light from a field of view that is approximately 45 degrees offset from a field of view of the light sensor 108.

For purposes of explanation and not limitation, in operation, the optical assembly 102 is configured to be used with the rearview assembly 100 when a secondary vehicle component is placed between the rearview assembly 100 and a windshield of the vehicle. Typically, when the secondary vehicle component blocks a field of view of the light sensor 108 that does not include the optical assembly 102, the light sensor 108 does not adequately monitor ambient light. The optical assembly 102 allows the light sensor 108 to be positioned substantially planarly on a circuit board 110 (FIG. 4), while receiving light offset from a forward field of view of the light sensor 108, such that any blockage of light caused by the secondary vehicle component has a reduced effect on the light sensor 108 sensing ambient light. The secondary vehicle component can be, but is not limited to, a rain sensor, an imager, a radar system, a sensor cover, a compass, a GPS module, the like, or a combination thereof.

With respect to FIGS. 4 and 8A-11C, according to a first embodiment, the optical assembly 102 can be configured to connect to the circuit board 110, such that the optical assembly 102 is in optical communication with the light sensor 108, which is also mounted to the circuit board 110. Typically, the first optical element 104 includes a first or front surface optical structure 112 and a second or rear surface optical structure 114. The first surface optical structure 112 can be configured to direct light in an approximately vertical direction, and the second surface optical structure 114 can be configured to concentrate light in an approximately horizontal direction (or an approximately orthogonal direction as the first surface optical structure 112).

According to an embodiment illustrated in FIGS. 4, 5, and 11A-11C, the first optical element 104 can be configured to alter the transmission path of the light through the first optical element 104 in an approximately vertical direction (first surface optical structure 112) and an approximately horizontal direction (second surface optical structure 114). The second surface optical structure 114 can be configured to receive light that is within an approximately −10 degrees to 90 degrees horizontal field of view with respect to a 0 degree optical axis extending approximately perpendicular to the circuit board 110 through the light sensor 108, and more particularly, light can be received from an approximately −2.5 degrees to 82.5 degrees horizontal field of view. The rear surface 114 can be configured to direct received light to be within an approximately 40 degrees horizontal illumination pattern, and more particularly, within an approximately 34.5 degrees horizontal illumination pattern. Typically, the first and second surface optical structures 112, 114 have textured surfaces, or other type of optical property, such that the front and rear surfaces 112, 114 can receive and pass light within desired horizontal fields of view and illumination patterns, respectively.

According to an embodiment illustrated in FIGS. 5, 8A, 8B, 9, and 10, the second optical element 106 can be configured to alter the transmission path of the light through the second optical element 106 in an approximately horizontal direction and in an approximately vertical direction. The second optical element 106 can include a first or front surface optical structure 116 and a second or rear surface optical structure 118. The first surface optical structure 116 can be configured to alter a transmission path of the light in an approximately horizontal direction, and the second surface optical structure 118 can be configured to alter a transmission path of the light in an approximately vertical direction (or an approximately orthogonal direction as the first surface optical structure 116), such that a field of view size (or an illumination pattern size) of light transmitted from the first optical element 104 to the second optical element 106 is approximately equal to the field of view size (or the illumination pattern size) of light transmitted from the second optical element 106 to the light sensor 108; however, the transmission angle of light transmitted between the first optical element 104 and the second optical element 106 is different than the transmission angle of light transmitted between the second optical element 106 and the light sensor 108.

The second surface optical structure 118 can be configured to receive light that is within an approximately −50 degrees to 20 degrees horizontal field of view with respect to a 0 degree optical axis extending approximately perpendicular to the circuit board 110 through the light sensor 108, and more particularly, light can be received from an approximately −40 degrees to 10 degrees vertical field of view. The rear surface 118 can be configured to direct received light to be within an approximately 10 degrees vertical illumination pattern, and more particularly, an approximately 3 degree vertical illumination pattern. Typically, front and rear surfaces 116, 118 have textured surfaces, or other type of optical property, such that the front and rear surfaces 116, 118 can receive and pass light within desired vertical fields of view and illumination patterns, respectively.

Thus, the first optical element 104 is configured to receive light that is offset from a field of view of the light sensor 108, and directs the light onto the second optical element 106. The second optical element 106 is configured to receive light from the first optical element 104, and redirects the light onto the light sensor 108. Typically, each of the first and second optical elements 104 and 106 directs the light in first and second directions that are approximately orthogonal to one another (e.g., an approximately horizontal direction and an approximately vertical direction). It should be appreciated by those skilled in the art that the second optical element 106 can be configured to have optical properties that further concentrate the light being transmitted there-through.

Figure 12:
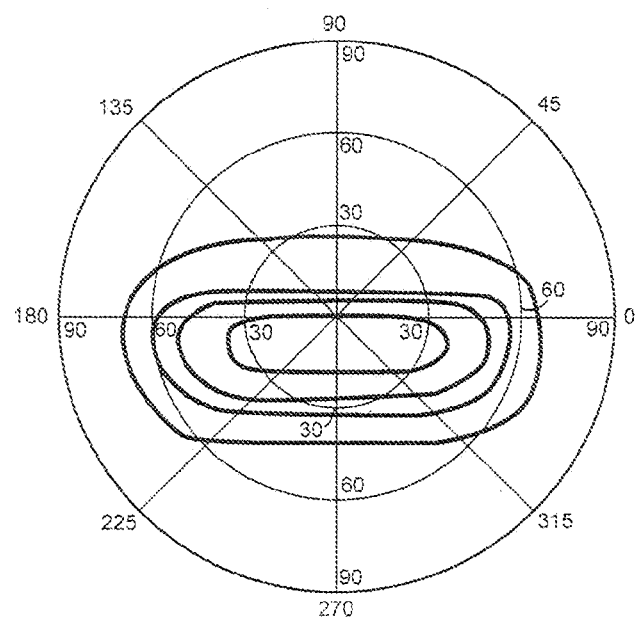
FIG. 12 is a chart illustrating a field of view of a light sensor having a prior art optical assembly.
Figure 13:
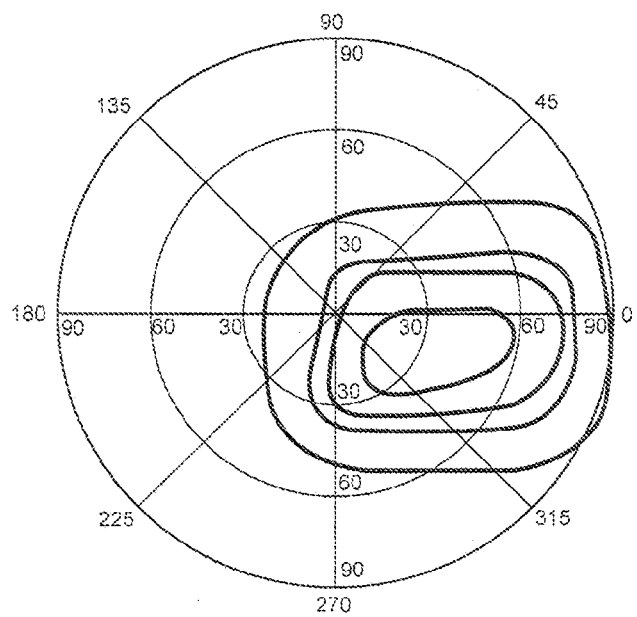
FIG. 13 is chart illustrating a field of view of a light sensor having an optical assembly, in accordance with one embodiment of the present invention.

In regards to FIGS. 12 and 13, the field of view of the light sensor 108, with a prior art optical assembly, is illustrated in FIG. 12. Such a field of view of the sensor 108 with the prior art optical assembly is adequate to sense light to control the auto-dimming rearview assembly 100 when there are no obstructions between the rearview assembly 100 and the vehicle windshield.

As illustrated in FIG. 13, the light sensor 108, when detecting light that has propagated through the optical assembly 102, and as compared to the fields of view illustrated in FIG. 12, the field of view is offset from an origin of an x,y axis. Thus, the optical assembly 102 and the light sensor 108 can have an approximately −20 degrees to 85 degrees horizontal field of view and an approximately −50 degrees to 35 degrees vertical field of view. More particularly, the optical assembly 102 and light sensor 108 can have an approximately 0 degree to 77.5 degrees horizontal field of view and an approximately −30 degrees to 10 degrees vertical field of view when the optical assembly 102 is configured to have flat cone angles, and an approximately −10 degrees to 85 degrees horizontal field of view and −40 degrees to 20 degrees vertical field of view then the optical assembly 102 is configured to have approximately 50 percent cone angles.

Thus, the light sensor 108 detecting light from a field of view as illustrated in FIG. 12 is adequate when there are no obstructions (e.g., the secondary vehicle component) between the rearview assembly 100 and the vehicle windshield. When there is an obstruction between the rearview assembly 100 and the vehicle windshield, the optical assembly 102 can offset the field of view for receiving light so that obstruction does not adversely affect the amount of light detected by the light sensor 108, such that auto-dimming of the rearview assembly 100 can be adequately controlled. Additionally, the light sensor 108 being located towards an outer edge of the circuit board 110, such that the light sensor 108 and optical assembly 102 are not located directly behind the secondary vehicle component, can further enhance the amount of light received by the light sensor 108.

The optical assembly 102 can attenuate the light that is propagating there-through, such that the intensity of the light received by the first surface 112 is greater than the intensity of the light received by the light sensor 108, according to one embodiment. The optical assembly 102 can be configured to reduce the attenuation of the light propagating there-through. Also, the optical assembly 102 may include a diffusant to diffuse the received light.

As to the rearview assembly 100, as illustrated in FIGS. 1, 2A, and 2B, the rearview assembly can include a housing 120 that defines an aperture 122, wherein the optical assembly 102 is configured to receive light through the aperture 122. The housing 120 can be configured to control the field of view of the optical assembly 102 and light sensor 108 by having one or more concave surfaces 124, as illustrated in FIG. 1. FIGS. 2A and 2B illustrate an alternative embodiment of the housing 120 and concave surface 124.

According to an alternate embodiment, the first and second surface optical structures 112, 114 and 116, 118, respectively, can be switched, such that the first surface optical structure 112 alters the light in an approximately horizontal direction, the second surface optical structure 114 alters the light in an approximately vertical direction, the first surface optical structure 116 alters the light in an approximately horizontal direction, and the second surface optical structure 118 alters the light in an approximately vertical direction. Such optical structures 112, 114, 116, and 118 may comprise a microgroove lens, a diffraction grating, or the like.

Additionally or alternatively, the optical assembly 102 and the light sensor 108 can be located on the right side of the rearview assembly 100, such that the first and second optical elements 104, 106 can be mirrored or rotated, respectively.

The rearview assembly 100, as described herein, can include an electro-optic mirror element, wherein a reflectance of a mirror element changes based upon light detected by the light sensor 108, and/or a display device that changes intensities based upon the light detected by the light sensor 108. Examples of rearview assemblies and/or light sensors are described in U.S. Pat. No. 6,870,656, entitled "ELECTROCHROMIC REARVIEW MIRROR ELEMENT INCORPORATING A THIRD SURFACE REFLECTOR"; U.S. Pat. No. 6,313,457, entitled "MOISTURE DETECTING SYSTEM USING SEMICONDUCTOR LIGHT SENSOR WITH INTEGRAL CHARGE COLLECTION"; U.S. Pat. No. 6,359,274, entitled, "PHOTODIODE LIGHT SENSOR"; U.S. Pat. No. 6,504,142, entitled "PHOTODIODE LIGHT SENSOR"; U.S. Pat. No. 6,402,328, entitled "AUTOMATIC DIMMING MIRROR USING SEMICONDUCTOR LIGHT SENSOR WITH INTEGRAL CHARGE COLLECTION"; U.S. Pat. No. 6,379,013, entitled "VEHICLE EQUIPMENT CONTROL WITH SEMICONDUCTOR LIGHT SENSORS"; U.S. Pat. No. 6,679,608, entitled "SENSOR DEVICE HAVING AN INTEGRAL ANAMORPHIC LENS"; U.S. Pat. No. 6,831,268, entitled "SENSOR CONFIGURATION FOR SUBSTANTIAL SPACING FROM A SMALL APERTURE"; U.S. Pat. No. 7,543,946, entitled "DIMMABLE REARVIEW ASSEMBLY HAVING A GLARE SENSOR"; and U.S. Pat. No. 6,742,904, entitled "VEHICLE EQUIPMENT CONTROL WITH SEMICONDUCTOR LIGHT SENSORS," which are hereby incorporated herein by reference in their entireties.

Figure 7:
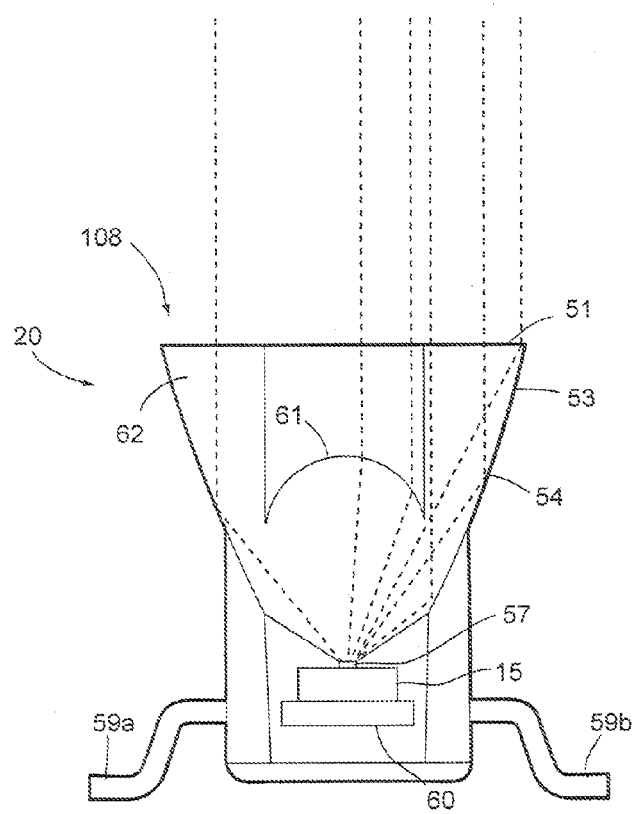
FIG. 7 is a cross-sectional view of the light sensor device shown in FIG. 6.
Figure 8A:
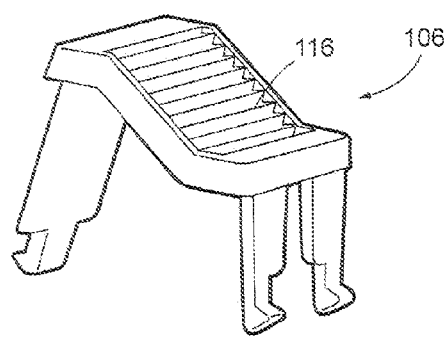
FIG. 8A is a perspective view of a second optical element of an optical assembly, in accordance with one embodiment of the present invention.
Figure 8B:
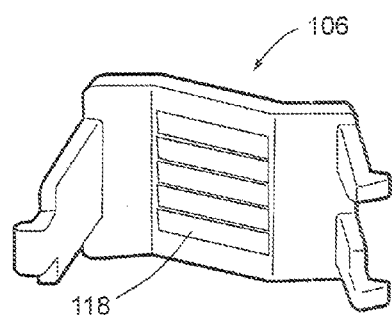
FIG. 8B is a rear perspective view of the second optical element of FIG. 8A.
Figure 9:
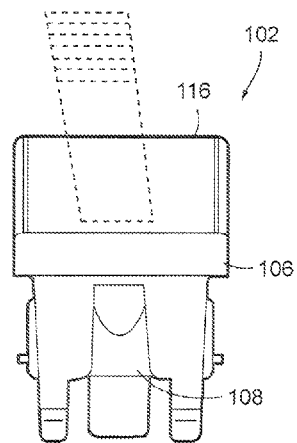
FIG. 9 is a diagram illustrating light propagation through a second optical element of an optical assembly, in accordance with one embodiment of the present invention.
Figure 10:
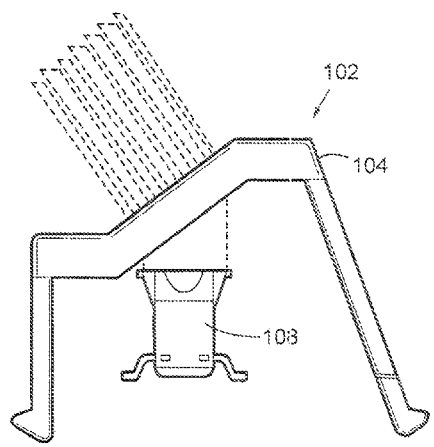
FIG. 10 is a diagram illustrating light propagation through a second optical element of an optical assembly, in accordance with one embodiment of the present invention.
Figure 11A:
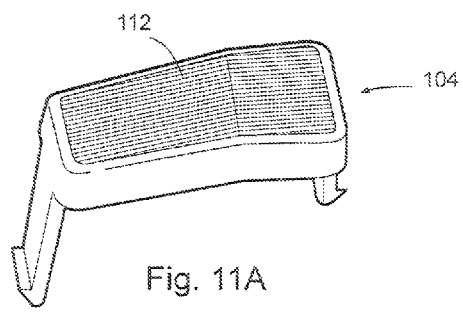
FIG. 11A is a perspective view of a first optical element of an optical assembly, in accordance with one embodiment of the present invention.
Figure 11C:
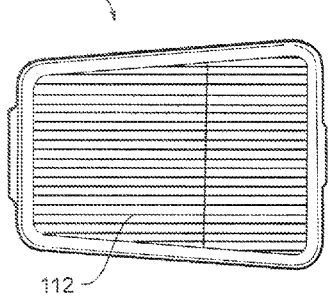
FIG. 11C is a front view of the first optical element of FIG. 11A.
Figure 11B:
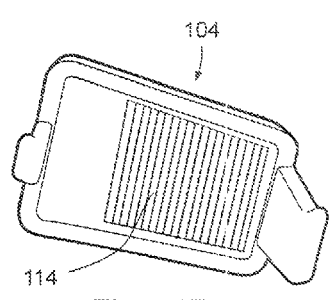
FIG. 11B is a rear view of the first optical element of FIG. 11A.

An example of a light sensor 108 that may be used with the embodiments of the present invention is shown in FIGS. 6 and 7. The light sensor 108 includes a support structure, such as a printed circuit board or a lead frame 60; an integrated sensing circuit 15 having an active sensing area 57 mounted on the support substrate for sensing optical radiation, preferably visible light; and an encapsulant 62 encapsulating the sensing circuit on the support structure. In general, the encapsulant 62 defines a lens structure 20 including an integral refracting lens portion 61 preferably having an elliptical refracting surface for focusing incident optical radiation onto active surface 57 of sensing circuit 15. Lens structure 20 further includes an optical radiation collector portion 53 surrounding the lens portion 61 for collecting and redirecting optical radiation that is not incident on lens portion 61 onto the active surface 57 of sensing circuit 15. The optical radiation collecting portion 53 includes a parabolic reflecting surface 54 that redirects incident optical radiation towards sensing circuit 15 by total internal reflection. Optical radiation collecting portion 53 also includes an annular optical radiation receiving surface 51 that lies in a plane perpendicular to the major axis of elliptical lens portion 61 and is disposed around elliptical lens portion 61. The encapsulant is preferably formed of a clear polymer. Additional details of this light sensor may be found in U.S. Pat. No. 6,831,268, entitled "SENSOR CONFIGURATION FOR SUBSTANTIAL SPACING FROM A SMALL APERTURE," the entire disclosure of which is incorporated herein by reference.

Thus, light sensor 108 may have its own integral optics that are provided in addition to the two optical elements 104 and 106 of optical assembly 102. It will be appreciated, however, that other light sensors may be used, which may or may not have their own integral optics.

Figure 14:
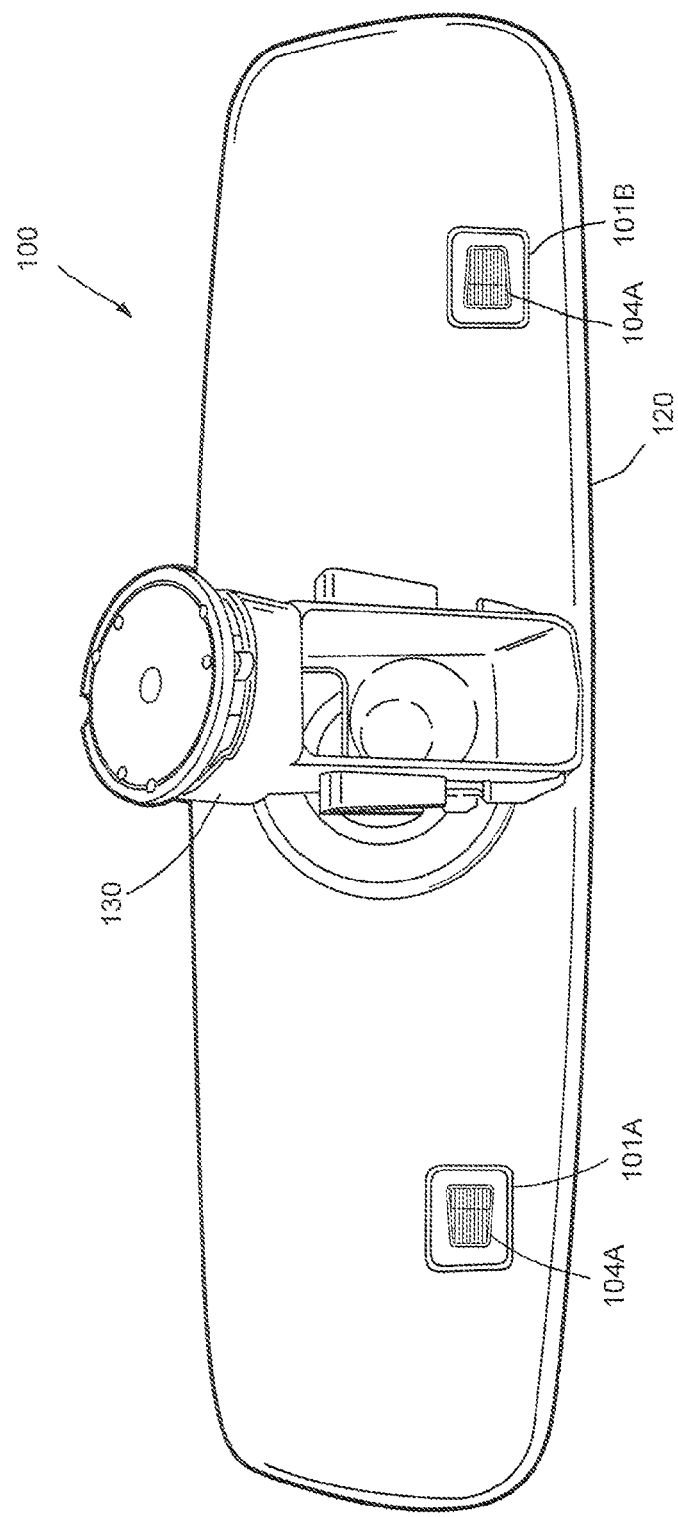
FIG. 14 is a perspective view of a rearview assembly having an optical assembly, in accordance with one embodiment of the present invention.

According to one embodiment shown in FIG. 14, a plurality of light sensor assemblies 101A and 101B can be included in the rearview assembly 100. Additionally, one or more of the plurality of light sensors 108 can be optically connected with one or more optical assemblies 102, respectively, to form ambient light sensor assemblies 101A and 101B. An example of a rearview assembly having at least two ambient light sensors is described in U.S. Pat. No. 8,620,523, filed on Jun. 12, 2012 and entitled, "REARVIEW ASSEMBLY WITH MULTIPLE AMBIENT LIGHT SENSORS," the entire disclosure of which is hereby incorporated herein by reference. Although the optical assembly 102 is designed to alleviate the problem associated with obstruction of the field of view of an ambient light sensor provided in a rearview assembly 100, providing first light sensor assembly 101A and second light sensor assembly 101B on the opposite sides of mirror mounting structure 130 further mitigates the problem caused by obstruction of the field of view of a single ambient light sensor assembly by components mounted to or near the mirror mounting structure. More specifically, this problem can be further addressed by spacing the light sensor assemblies 101A and 101B at least about 10 cm apart and processing the output signals from the two sensor subassemblies so as to use the output of the light sensor with the least obstructed field of view (i.e., that with the output signal representing the greater amount of received light).

FIGS. 15-19 show an alternate construction of optical assembly 102c. As shown, assembly 102c differs from the optical assembly 102 shown in FIGS. 4 and 8A-11C in that the second optical element 106c is attached to first optical element 104c instead of to circuit board 110 such that both optical elements may be mounted to rearview housing 120 rather than one mounted to housing 120 and the other mounted to circuit board 110 as in the first embodiment. Such an attachment of the two optical elements 104c and 106c may be by any means. As shown it is by means of a heat stake. This alternative construction provides the benefit that the relative physical positioning of the two optical elements remains constant from part to part.

Figure 15:
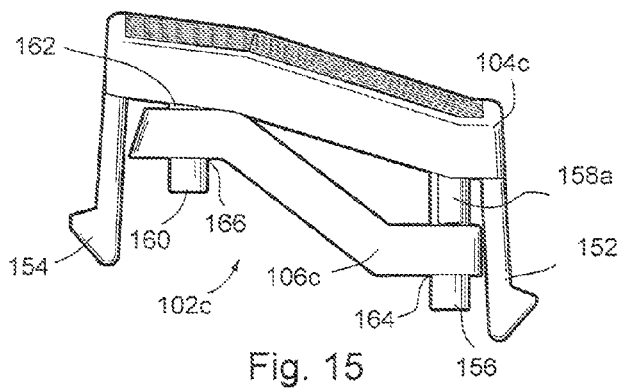
FIG. 15 is a perspective view of an optical assembly, in accordance with another one embodiment of the present invention.
Figure 16:
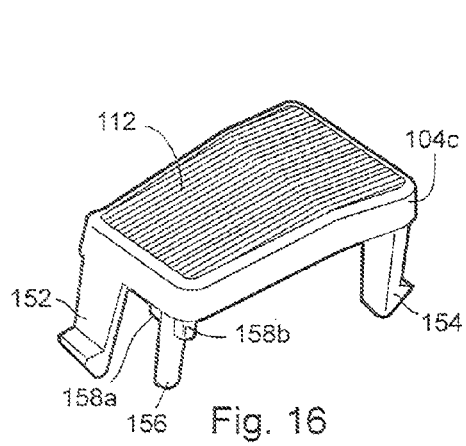
FIG. 16 is a front perspective view of a first optical element of the optical assembly shown in FIG. 15.
Figure 17:
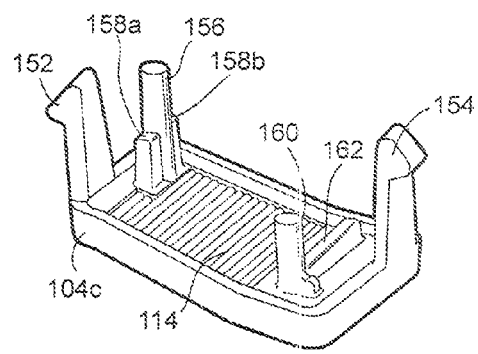
FIG. 17 is a rear perspective view of the first optical element shown in FIG. 16.

As illustrated in FIGS. 15-17, first optical element 104c includes first surface optical structure 112 and second surface optical structure 114 as in the first embodiment. First optical element 104c differs in that it includes a first heat stake post 156 and a second heat stake post 160, and in that resilient legs 152 and 154 are configured slightly differently. Resilient legs 152 and 154 are configured for snapping into aperture 122 of rearview housing 120. First optical element 104c further includes shoulders 158a and 158b on opposing sides of first heat stake post 156 and a shoulder 162 adjacent second heat stake post 160.

Figure 18:
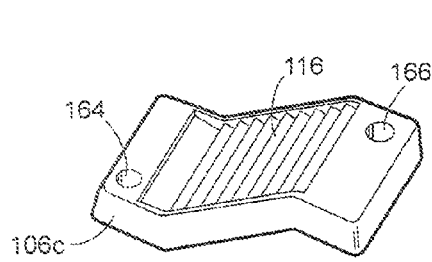
FIG. 18 is a front perspective view of a second optical element of the optical assembly shown in FIG. 15.
Figure 19:
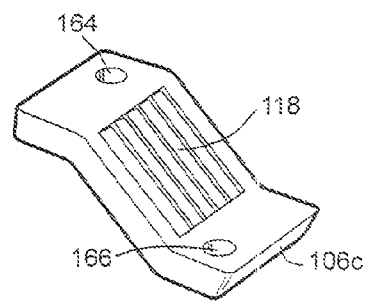
FIG. 19 is a rear perspective view of the second optical element shown in FIG. 16.

As illustrated in FIGS. 15, 18, and 19, second optical element 106c includes first surface optical structure 116 and second surface optical structure 118 as in the first embodiment. Second optical element 106c differs in that it includes a first heat stake aperture 164 and a second heat stake aperture 166 adapted to receive first heat stake post 156 and second heat stake post 160, respectively, of first optical element 104c. Second optical element 106c further differs from second optical element 106 of the first embodiment in that it does not include resilient legs that otherwise are used to snap to circuit board 110. Instead, as mentioned above, second optical element 106c is secured to first optical element 104c, which in turn is mounted to housing 120. Shoulders 158a, 158b, and 162 are provided on first optical element 104c to provide a stop for stopping the insertion of heat stake posts 156 and 160 at a specific position as shown in FIG. 15 so that the first and second optical elements will have the desired positional relationship when the front surfaces of second optical element 106c come into contact with shoulders 158a, 158b, and 162. Heat may then be applied to the ends of heat stake posts 156 and 160 to melt them and thereby secure second optical element 106c in the desired position.

Figure 20:
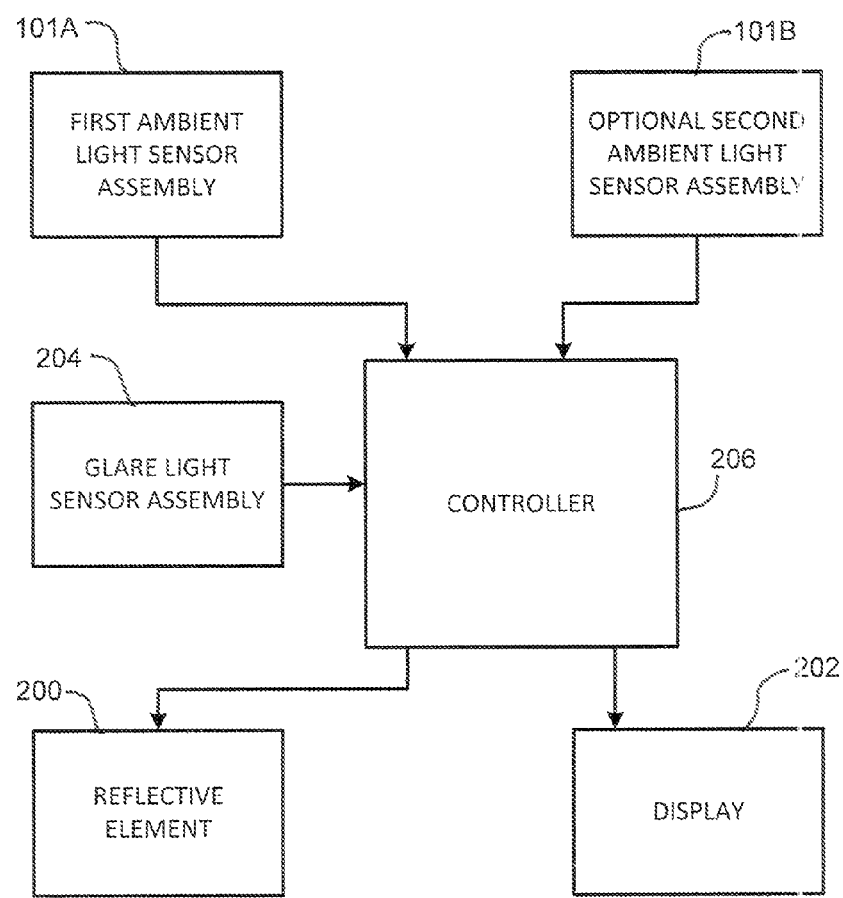
FIG. 20 is a block diagram of a rearview assembly, in accordance with one embodiment of the present invention.

FIG. 20 shows an example of an electrical circuit for use in a rearview assembly. The rearview assembly may include a rearview element, which may comprise a reflective element 200 and/or a display 202, a forward-facing ambient light sensor assembly 101A, a rearward-facing glare light sensor assembly 204, and a controller 206. Reflective element 200 may be an electro-optic element, such as an electrochromic element, having a reflectivity that may be changed in response to an electrical signal. Controller 206 may control the reflectivity of the reflective element 200 in response to output signals from ambient light sensor assembly 101A and glare light sensor assembly 204. In this way, controller 206 may adjust a brightness of the images presented by reflection from the reflective element. Controller 206 may also adjust a brightness of the images presented by the display 202 in response to output signals from ambient light sensor assembly 101 and glare light sensor assembly 204. The rearview assembly may further include an optional second forward-facing ambient light sensor assembly 1016. Controller 206 may process the output signals from the two ambient light sensor assemblies 101A and 1016 so as to use the output of the light sensor with the least obstructed field of view (i.e., that with the output signal representing the greater amount of received light).

It should be appreciated by those skilled in the art that any dimensions and shapes referenced in the figures are approximations and are for purposes of explanation and not limitation, such that, the components can have larger or smaller dimensions and/or alternative shapes.

Advantageously, the optical assembly 102 and the sensor 108 can be used to detect ambient light by having an offset field of view, such that an obstruction in front of the sensor 108 does not adversely affect the light detection of the sensor 108. Thus, an auto-dimming mirror element of a rearview assembly 100 can adequately be controlled by the amount of light detected by the sensor 108. It should be appreciated by those skilled in the art that the optical assembly 102, the sensor 108, and/or the rearview assembly 100 can have additional or alternative advantages. It should further be appreciated by those skilled in the art that the components described herein can be combined in alternative combinations, not explicitly described herein.

Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

What is claimed is:

1. An optical assembly comprising:
    a first optical element configured to receive light and alter a transmission path of the light through said first optical element in a first direction and a second direction; and
    a second optical element in optical communication with said first optical element, said second optical element configured to receive the light from said first optical element, and alter a transmission path of the light through said second optical element in said first and second directions, wherein the light is passed through said first and second optical elements such that a light sensor receives light from a field of view that is approximately 30 degrees to 60 degrees offset from a field of view of the light sensor.

2. The optical assembly of claim 1, wherein the first direction is a substantially horizontal direction, such that said first optical element is configured to alter the transmission path of the light through said first optical element in the substantially horizontal direction.

3. The optical assembly of claim 1, wherein the second direction is a substantially vertical direction, such that said second optical element is configured to alter the transmission path of the light through said first optical element in the substantially vertical direction.

4. The optical assembly of claim 1, wherein the light is passed through said second optical element such that the light sensor receives light from a field of view that is approximately 30 degrees to 60 degrees horizontally offset from a field of view of the light sensor.

5. The optical assembly of claim 1, wherein the light sensor receives light from a field of view that is approximately 40 degrees to 50 degrees offset from a field of view of the light sensor.

6. The optical assembly of claim 1, wherein the light sensor receives light from a field of view that is approximately 45 degrees offset from a field of view of the light sensor.

7. The optical assembly of claim 1, wherein said first and second optical elements are configured for mounting in an auto-dimming rearview assembly.

8. A light sensor assembly comprising:
    a light sensor;
    a first optical element configured to receive light and alter a transmission path of the light through said first optical element in a first direction and a second direction; and
    a second optical element in optical communication with said first optical element, said second optical element configured to receive the light from said first optical element, and alter a transmission path of the light through said second optical element in the first and second directions, wherein the light is passed through said first and second optical elements such that said light sensor receives light from a field of view that is approximately 30 degrees to 60 degrees offset from a field of view of said light sensor.

9. The light sensor assembly of claim 8, wherein the first direction is a substantially horizontal direction, such that said first optical element is configured to alter the transmission path of the light through said first optical element in the substantially horizontal direction.

10. The light sensor assembly of claim 8, wherein the second direction is a substantially vertical direction, such that said second optical element is configured to alter the transmission path of the light through said first optical element in the substantially vertical direction.

11. The light sensor assembly of claim 8, wherein the light is passed through said second optical element such that said light sensor receives light from a field of view that is approximately 30 degrees to 60 degrees horizontally offset from a field of view of said light sensor.

12. The light sensor assembly of claim 8, wherein the light sensor receives light from a field of view that is approximately 40 degrees to 50 degrees offset from a field of view of the light sensor.

13. The light sensor assembly of claim 8, wherein said light sensor is an ambient light sensor.

14. The light sensor assembly of claim 8, wherein said light sensor comprises:
    a support structure;
    a sensing element mounted on said support substrate for sensing light and generating an electrical output signal in response thereto; and
    an encapsulant encapsulating said sensing element on said support structure, said encapsulant being configured to define a lens portion for focusing incident light onto an active surface of said sensing element, and an optical radiation collector portion surrounding the lens portion for collecting and redirecting light that is not incident on the lens portion onto the active surface of said sensing element.

15. A rearview assembly for a vehicle comprising:
    a housing configured for mounting to the vehicle;
    a rearview element disposed in said housing that presents images of a scene rearward of the vehicle;
    a light sensor assembly disposed in said housing, said light sensor comprising:
    a light sensor for outputting an electrical signal representing intensity of light impinging upon a light receiving surface of the light sensor;
    a first optical element configured to receive light and alter a transmission path of the light through said first optical element in a first direction and a second direction; and
    a second optical element in optical communication with said first optical element, said second optical element configured to receive the light from said first optical element and alter a transmission path of the light through said second optical element in the first and second directions, wherein the light is passed through said second optical element such that said light sensor receives light from a field of view that is approximately 30 degrees to 60 degrees horizontally offset from a field of view of said light sensor; and
    a controller for receiving the electrical signal of said light sensor and for adjusting a brightness of the images presented by said rearview element.

16. The rearview assembly of claim 15, wherein said rearview element includes a display positioned in said housing, wherein the controller adjusts the brightness of the images presented by said rearview element by adjusting the brightness of said display.

17. The rearview assembly of claim 15, wherein said rearview element includes an electro-optic mirror element having a reflectance that is adjustable, wherein the controller adjusts the brightness of the images presented by said rearview element by adjusting the reflectance of said electro-optic mirror element.

18. The rearview assembly of claim 15, wherein said rearview element includes a display positioned in said housing, wherein the controller adjusts the brightness of the images presented by said rearview element by further adjusting the brightness of said display.

19. The rearview assembly of claim 15 and further comprising a second light sensor assembly, wherein both said first and second light sensor assemblies are generally facing forward with respect to a forward driving orientation of the vehicle and configured to detect ambient light, wherein said second light sensor assembly is spaced apart at least about 10 cm from said first light sensor assembly.

20. The rearview assembly of claim 15, wherein said light sensor comprises:
  a support structure;
  a sensing element mounted on said support substrate for sensing light and generating an electrical output signal in response thereto; and
  an encapsulant encapsulating said sensing element on said support structure, said encapsulant being configured to define a lens portion for focusing incident light onto an active surface of said sensing element, and an optical radiation collector portion surrounding the lens portion for collecting and redirecting light that is not incident on the lens portion onto the active surface of said sensing element.

\* \* \* \* \*